United States Patent
Dong et al.

(10) Patent No.: US 11,282,912 B2
(45) Date of Patent: Mar. 22, 2022

(54) DISPLAY MODULE, METHOD FOR MANUFACTURING THE SAME, AND DISPLAY DEVICE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Xiangdan Dong, Beijing (CN); Ming Hu, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 273 days.

(21) Appl. No.: 16/623,760

(22) PCT Filed: Sep. 6, 2019

(86) PCT No.: PCT/CN2019/104701
§ 371 (c)(1),
(2) Date: Dec. 17, 2019

(87) PCT Pub. No.: WO2020/052498
PCT Pub. Date: Mar. 19, 2020

(65) Prior Publication Data
US 2021/0335982 A1    Oct. 28, 2021

(30) Foreign Application Priority Data

Sep. 11, 2018  (CN) .......................... 201811058212.X

(51) Int. Cl.
*H01L 27/32*   (2006.01)
*G02F 1/1362*  (2006.01)
(Continued)

(52) U.S. Cl.
CPC .... *H01L 27/3276* (2013.01); *G02F 1/136295* (2021.01); *H01L 27/323* (2013.01);
(Continued)

(58) Field of Classification Search
CPC ......................... H01L 27/3276; H01L 51/5237
See application file for complete search history.

(56) References Cited

U.S. PATENT DOCUMENTS 9,818,974 B2    11/2017  Kwon et al.
2014/0125533 A1  5/2014  Shi et al.
(Continued)

FOREIGN PATENT DOCUMENTS

CN  102637386 A   8/2012
CN  102931199 A   2/2013
(Continued)

OTHER PUBLICATIONS

First Chinese Office Action dated Nov. 11, 2020 from CNIPA for Chinese Patent Application No. 201811058212.X, 12 pages.
(Continued)

*Primary Examiner* — Douglas M Menz
(74) *Attorney, Agent, or Firm* — Kinney & Lange, P.A.

(57) ABSTRACT

A display module and a method for manufacturing a display module, and a display device are provided. The display module includes a display panel, a main flexible printed circuit board, a secondary flexible printed circuit board and a driving circuit. The display panel comprises a signal line. The main flexible printed circuit board is at least partially on a first side of the display panel and is electrically connected to the signal line. The secondary flexible printed circuit board is at least partially on a second side of the display panel and is electrically connected to the signal line. The driving circuit is configured to provide signals to the signal line through the main flexible printed circuit board and the secondary flexible printed circuit board respectively.

19 Claims, 3 Drawing Sheets

(51) Int. Cl.
　　　*H01L 51/52*　　　(2006.01)
　　　*H01L 51/56*　　　(2006.01)
　　　*H05K 1/18*　　　(2006.01)

(52) U.S. Cl.
　　　CPC .......... *H01L 51/5237* (2013.01); *H01L 51/56* (2013.01); *H05K 1/189* (2013.01); *H01L 2227/323* (2013.01); *H05K 2201/10136* (2013.01)

(56) References Cited

U.S. PATENT DOCUMENTS

2017/0153733 A1　　6/2017　Li et al.
2019/0294281 A1*　9/2019　Kim ..................... G06F 3/0412

FOREIGN PATENT DOCUMENTS

| | | |
|---|---|---|
| CN | 103927039 A | 7/2014 |
| CN | 104808864 A | 7/2015 |
| CN | 106055171 A | 10/2016 |
| CN | 106406611 A | 2/2017 |
| CN | 106887186 A | 6/2017 |
| CN | 110164913 A | 8/2019 |
| JP | 2006126470 A | 5/2006 |

OTHER PUBLICATIONS

International Search Report and Written Opinion dated Oct. 28, 2019 for corresponding PCT Application No. PCT/CN2019/104701.

* cited by examiner ness Patent Application No. 201811058212.X filed on Sep. 11, 2018 with CNIPA, incorporated herein by reference in entirety.
DISPLAY MODULE, METHOD FOR MANUFACTURING THE SAME, AND DISPLAY DEVICE

CROSS-REFERENCE TO RELATED APPLICATION

This application is a Section 371 National Stage Application of International Application No. PCT/CN2019/104701, filed on Sep. 6, 2019, entitled "DISPLAY MODULE, METHOD FOR MANUFACTURING THE SAME, AND DISPLAY DEVICE", which claims priority to Chinese Patent Application No. 201811058212.X filed on Sep. 11, 2018 with CNIPA, incorporated herein by reference in entirety.

TECHNICAL FIELD

Embodiments of the present disclosure relate to the field of display technology, and in particular, to a display module and a method for manufacturing a display module, and a display device.

BACKGROUND

In a conventional display device, a voltage drain drain is generally supplied to a voltage drain drain line (also referred to as a VDD line) through a chip. As an example, the chip may supply the voltage drain drain to the voltage drain drain line from one side of the display device.

SUMMARY

According to an aspect of the present disclosure, there is provided a display module, comprising a display panel, a main flexible printed circuit board, a secondary flexible printed circuit board and a driving circuit, wherein:
the display panel comprises a signal line;
the main flexible printed circuit board is at least partially on a first side of the display panel and is electrically connected to the signal line;
the secondary flexible printed circuit board is at least partially on a second side of the display panel and is electrically connected to the signal line; and
the driving circuit is configured to provide signals to the signal line through the main flexible printed circuit board and the secondary flexible printed circuit board respectively.

According to a specific implementation manner, in the display module provided by some embodiments of the present disclosure, the display panel further comprises a touch assembly; and the secondary flexible printed circuit board comprises a touch flexible printed circuit board.

According to a specific implementation manner, in the display module provided by some embodiments of the present disclosure, the main flexible printed circuit board further comprises a portion extending from the first side to a center of the display panel, and the driving circuit is on the portion of the main flexible printed circuit board; and a first end of the driving circuit is electrically connected to a first end of the main flexible printed circuit board, and a second end of the driving circuit is electrically connected to a first end of the touch flexible printed circuit board.

According to a specific implementation manner, in the display module provided by some embodiments of the present disclosure, the signal line and the data line of the display panel are formed of a same material and in a same layer; and the display panel further comprises a first connection pattern on the first side and a second connection pattern on the second side, wherein both ends of the first connection pattern are respectively electrically connected to the signal line and a second end of the main flexible printed circuit board, and both ends of the second connection pattern are respectively electrically connected to the signal line and a second end of the touch flexible printed circuit board.

According to a specific implementation manner, in the display module provided by some embodiments of the present disclosure, the first connection pattern and the second connection pattern are electrically connected to the signal line through via holes, respectively.

According to a specific implementation manner, in the display module provided by some embodiments of the present disclosure, the touch assembly has a touch pattern layer; and the first connection pattern and the second connection pattern are both formed in a same layer as the touch pattern layer and formed of a same material as the touch pattern layer.

According to a specific implementation manner, in the display module provided by some embodiments of the present disclosure, the first side and the second side are opposite to each other.

According to a specific implementation manner, in the display module provided by some embodiments of the present disclosure, the display module further comprises: a bottom film, a super clean foam protective film, and a structured organic film between the display panel and the driving circuit; and a thin film for encapsulation between the touch assembly and the signal line.

According to a specific implementation manner, in the display module provided by some embodiments of the present disclosure, the display panel comprises an OLED display panel; the OLED display panel further comprises a base substrate and a thin film for encapsulation opposite to each other; and the touch assembly is on a side of the thin film for encapsulation away from the base substrate.

According to a specific implementation manner, in the display module provided by some embodiments of the present disclosure, the display panel comprises a liquid crystal display panel; the liquid crystal display panel comprises a first substrate and a second substrate opposite to each other; and the touch assembly is between the first substrate and the second substrate.

According to another aspect of the present disclosure, there is provided a display device, comprising the display module according to any one of the foregoing embodiments.

According to a further aspect of the present disclosure, there is provided a method for manufacturing a display module, the method comprising:
providing a display panel, which comprises a signal line;
providing a main flexible printed circuit board, the main flexible printed circuit board being at least partially on a first side of the display panel and being electrically connected to the signal line;
providing a secondary flexible printed circuit board, the secondary flexible printed circuit board being at least partially on a second side of the display panel and being electrically connected to the signal line; and
providing a driving circuit to provide signals to the signal line through the main flexible printed circuit board and the secondary flexible printed circuit board respectively.

According to a specific implementation manner, in the method for manufacturing the display module provided by some embodiments of the present disclosure, the display panel further comprises a touch assembly; and the secondary flexible printed circuit board comprises a touch flexible printed circuit board.

According to a specific implementation manner, in the method for manufacturing the display module provided by some embodiments of the present disclosure, the providing a display panel comprises sub-steps: forming a signal line and a data line on the display panel through a same patterning process; and forming on the display panel a touch pattern layer, a first connection pattern on the first side and a second connection pattern on the second side through a same patterning process, so that both ends of the first connection pattern are electrically connected to the signal line and a second end of the main flexible printed circuit board, respectively, while both ends of the second connection pattern are electrically connected to the signal line and a second end of the secondary flexible printed circuit board, respectively.

According to a specific implementation manner, in the method for manufacturing the display module provided by some embodiments of the present disclosure, the first connection pattern and the second connection pattern are electrically connected to the signal line through via holes which are formed in the display panel, respectively.

According to a specific implementation manner, in the display module provided by some embodiments of the present disclosure, the driving circuit is disposed at a side of the display panel opposite to a display surface thereof.

According to a specific implementation manner, in the display module provided by some embodiments of the present disclosure, the driving circuit comprises an integrated circuit.

According to a specific implementation manner, in the display module provided by some embodiments of the present disclosure, the main flexible printed circuit board is bent from a display surface of the display panel to a side of the display panel opposite to the display surface, and/or the secondary flexible printed circuit board is bent from a display surface of the display panel to a side of the display panel opposite to the display surface.

According to a specific implementation manner, in the method for manufacturing the display module provided by some embodiments of the present disclosure, the touch assembly has a touch pattern layer; wherein the providing a driving circuit comprises a sub-step: providing the driving circuit on a portion of the main flexible printed circuit board extending from the first side to a center of the display panel, so that a first end of the driving circuit is electrically connected to a first end of the main flexible printed circuit board, and a second end of the driving circuit is electrically connected to a first end of the touch flexible printed circuit board.

BRIEF DESCRIPTION OF THE DRAWINGS

In order to more clearly illustrate the embodiments of the present disclosure, the drawings to be used in the description of the embodiments will be briefly described below. Obviously, the drawings referred to in the following description only represent some embodiments of the present disclosure, and other drawings may be obtained by those skilled in the art based on these drawings without any creative efforts.

DETAILED DESCRIPTION OF EMBODIMENTS

Figure 1:
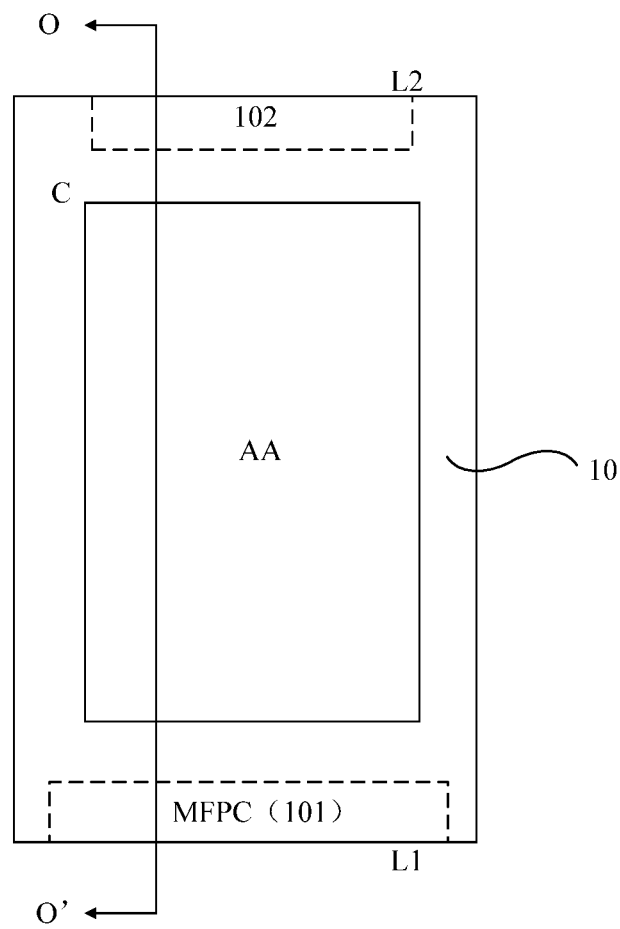
FIG. 1 is a schematic structural view of a display device according to an embodiment of the present disclosure.

The technical solutions in the embodiments of the present disclosure will be clearly and completely described below with reference to the accompanying drawings in the embodiments of the present disclosure. It is obvious that the described embodiments are only a part of the embodiments of the present disclosure, but not all of the embodiments. All other embodiments obtained by those skilled in the art based on the embodiments of the present disclosure without any creative efforts fall within the scope of the present disclosure.

Unless otherwise defined, the technical terms or scientific terms used in the embodiments of the present disclosure shall have the ordinary meanings which may be understood by those skilled in the art to which the present disclosure belongs. The terms "first", "second", and the like used in the embodiments of the present disclosure do not indicate any order, quantity, or importance, but are only used to distinguish different components. The word "comprise", "include" or the like means that the element or item preceding the word encompasses the elements or items and their equivalents listed after the word, but does not exclude other elements or items. The word "connect", "join" or the like is not limited to physical or mechanical connection, but may include electrical connection, no matter it is direct or indirect. The words "up", "down", "left", "right", etc. are only intended to indicate relative positional relationships. Therefore, if an absolute position of a described object changes, this relative positional relationship may change accordingly.

In the following description, reference numerals listed below will be used to refer to the various components in the embodiments of the present disclosure: 01—display module; 10—display panel; 100—driving circuit; 20—signal line; 101—main flexible printed circuit board; 102—secondary flexible printed circuit board; 103—touch assembly; 1031—pattern layer; 1032—bridge connection layer; 200—second connection pattern; L1—first side; L2—second side; TFE—thin film for encapsulation; and H—via hole.

As mentioned above, in general, in the display device, the voltage drain drain may be supplied to the voltage drain drain line through a chip, for example, from one side. However, it is well known that the VDD line itself has a certain resistance. Therefore, as the distance from the chip (for example, the distance between the side of the display panel opposite to the chip and the chip) increases, a voltage drain drain signal will exhibit a resistance drop (IR Drop) phenomenon. In such a case, the signal strength will be significantly attenuated, resulting in a reduction in a long range uniformity (LRU) of the display device and a reduction in the quality of the display screen.

To this end, an embodiment of the present disclosure provides a display module. As shown in FIG. 1, the display module 01 includes a display panel 10. In addition, from a top view, the display panel 10 is generally divided into an effective display area AA and a non-display area C located around the effective display area.

Figure 2:
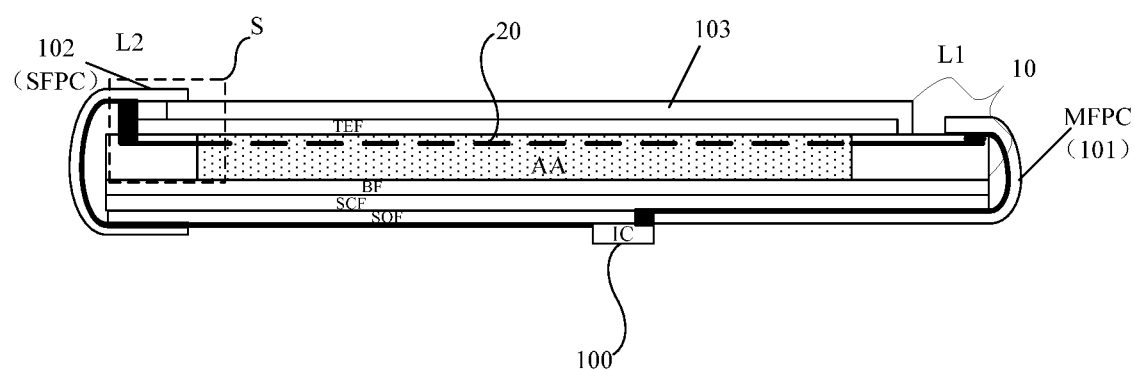
FIG. 2 is a schematic cross-sectional view of the display device shown in FIG. 1, taken along a line 0-0'.

As shown in FIG. 2, viewed from a hierarchical relationship, according to an embodiment of the present disclosure, the display module further includes a display panel 10 and a main flexible printed circuit board (MFPC, also referred to as a display flexible printed circuit board) 101, a secondary flexible printed circuit board (SFPC) 102 and a driving circuit 100.

Specifically, the display panel 10 is further provided with a signal line 20 therein.

The main flexible printed circuit board (MFPC) 101 is at least partially located on a first side L1 of the display panel 10. Further, as an example, the main flexible printed circuit board (MFPC) 101 is electrically connected to a first connection pattern located on the first side L1 of the display panel 10 (i.e., in the non-display area C). The secondary flexible printed circuit board (SFPC) 102 is at least partially located on a second side L2 of the display panel 10. Further, as an example, the secondary flexible printed circuit board (SFPC) 102 is electrically connected to a second connection pattern located on the second side L2 of the display panel 10 (i.e., in the non-display area C). Regarding the first connection pattern and the second connection pattern, the applicant will introduce them in more detail below with reference to FIG. 3.

In addition, it should also be noted that although the first side L1 and the second side L2 are shown as two opposite sides of the display panel 10 in FIG. 1 and FIG. 2, from the teaching of the present disclosure, it should be appreciated by those skilled in the art that the first side L1 and the second side L2 may also be two adjacent sides of the display panel 10, and the present disclosure is intended to cover all such alternatives.

Further, in the embodiments of the present disclosure, the driving circuit 100 is electrically connected to both the main flexible printed circuit board (MFPC) 101 and the secondary flexible printed circuit board (SFPC) 102, so as to supply signals (in particular, voltage drain drain signals) from the first side and the second side of the display panel 10 to the signal line 20, via the main flexible printed circuit board (MFPC) 101 and the secondary flexible printed circuit board (SFPC) 102, respectively. As an example, the voltage drain drain signal may also be referred to as a VDD signal, and meanwhile, the signal line 20 may also be referred to as a VDD signal line.

According to the embodiments of the present disclosure, the driving circuit 100 generally takes the form of an integrated circuit (IC), but the present disclosure is not limited thereto. In addition, as an example, the integrated circuit is generally disposed on a back side of the display panel 10. In the embodiments described below, a specific implementation manner of the present disclosure will be described in detail by taking the driving circuit 100 including the integrated circuit as an example. Of course, according to an embodiment of the present disclosure, while providing, for example, voltage drain drain signals to the signal line 20 through two flexible printed circuit boards, the integrated circuit may also provide the display panel 10 with other display-related signals through the main flexible printed circuit board (MFPC) 101.

Herein, it should be noted that the expression "back side of the display panel" generally refers to a side of the display panel opposite to a display surface (or a display side). It can be understood that, due to flexibility of the main flexible printed circuit board (MFPC) 101 and the secondary flexible printed circuit board (SFPC) 102, they may also be bent from the display surface of the display panel to the back side of the display panel (for example, as shown in FIG. 2), so that they can be electrically connected to the integrated circuit located on the back side of the display panel. That is to say, for two flexible printed circuit boards, in addition to a first portion located on the corresponding side (i.e., the first side L1 or the second side L2), they may also include a second portion located on the back side of the display panel, that is, in the effective display area of the display panel, and the integrated circuit is kept to be electrically connected to such a second portion.

In summary, in the display module provided by the embodiments of the present disclosure, the driving circuit simultaneously inputs, for example, voltage drain drain signals to the signal line through the main flexible printed circuit board on the first side and the secondary flexible printed circuit board on the second side. Thereby, compared with the case where a driving circuit is used to input a voltage drain drain signal from one side in a conventional scheme, in the embodiments of the present disclosure, the resistance drop (IR Drop) phenomenon due to the long-distance transmission on the signal line and the resistance of the signal line itself is effectively avoided, thereby facilitating the improvement of the long range uniformity (LRU) of the display device.

Further, as an example, in the embodiments of the present disclosure, the integrated circuit may be electrically connected to the main flexible printed circuit board (MFPC) 101 and the secondary flexible printed circuit board (SFPC) 102 by any appropriate connection method, as long as the integrated circuit can supply, for example, voltage drain drain signals from the first side and the second side of the display panel 10 to the signal line 20, via the main flexible printed circuit board (MFPC) 101 and the secondary flexible printed circuit board (SFPC) 102, respectively. Illustratively, in some embodiments of the present disclosure, the above integrated circuit may be directly disposed on the main flexible printed circuit board (MFPC) (for example, disposed on a portion of the main flexible printed circuit board on the back side of the display panel), thereby integrated circuit and the main flexible printed circuit board (MFPC) can form a chip on film (COF) structure. Further, as an example, in some other embodiments, the main flexible printed circuit board (MFPC) may further include a system on film structure.

Specifically, the case where the main flexible printed circuit board (MFPC) includes a system on film is taken as an example, and the connection manner of the main flexible printed circuit board (MFPC) and the secondary flexible printed circuit board (SFPC) 102 may refer to FIG. 2. That is to say, a first end of the main flexible printed circuit board (MFPC) is electrically connected to the first side L1 (particularly, the first connection pattern) of the display panel 10, and a second end of the main flexible printed circuit board (MFPC) is electrically connected to a first end of the driving circuit 100. In addition, a first end of the secondary flexible printed circuit board is electrically connected to the second side L2 (particularly, the second connection pattern) of the display panel 10, and a second end of the secondary flexible printed circuit board is electrically connected to a second end of the driving circuit 100. Herein, it should be noted that the first end and the second end of each of the flexible printed circuit boards (specifically, the main flexible printed circuit board and the secondary flexible printed circuit board) generally refer to two opposite crimping ends thereof.

In addition, it should also be noted that, for the display module 01 in the embodiments of the present disclosure, other related film layers are generally attached to the back side of the display panel 10, for example, they are attached between the display panel 10 and the integrated circuit. As an example, such film layers may include a bottom film (BF), a super clean foam (SCF) protective film, a structured organic film (SOF), etc., which will not be described in detail herein.

In some embodiments of the present disclosure, as a further example, the first side L1 and the second side L2 are opposite to each other. That is to say, the first side L1 and the second side L2 are two opposite sides in the non-display area C of the display panel, respectively. In this way, the resistance drop (IR Drop) phenomenon caused by the long-distance transmission on the signal line 20 and the resistance of the signal line 20 itself, as well as the signal attenuation phenomenon caused by them may be improved to the greatest extent. Regarding such a specific embodiment, FIG. 1 and FIG. 2 in the present disclosure show the details.

According to some embodiments of the present disclosure, the display panel 10 may further include a touch assembly 103 so as to provide an additional touch function to the display panel 10 having only a display function, and to promote the use of the display panel 10 in for example a handheld terminal or the like. At this time, the above display module 01 may further include a touch flexible printed circuit board (TFPC) connected to the touch assembly 103. Further, as an example, the aforementioned secondary flexible printed circuit board (SFPC) may be served as such a touch flexible printed circuit board (TFPC), so as to simplify the manufacturing process and reduce the production cost. In such a case, while the voltage drain drain signal is input to the signal line 20 through the touch flexible printed circuit board (TFPC), the above integrated circuit may also input other touch-related signals to the touch assembly 103 according to actual needs. The present disclosure is intended to cover all of these alternatives.

Herein, it should be noted that the above-mentioned touch assembly 103 in the display panel 10 may be of an in-cell structure or an on-cell structure.

In addition, it should be noted that in the embodiments of the present disclosure, the display panel may be a liquid crystal display (LCD), or an organic light emitting diode (OLED) display panel. Of course, alternatively, the display panel may be any other suitable type of display panel.

For the LCD, for example, in the on cell structure, the touch assembly 103 is located on a side of an upper substrate of the display panel 10 away from a lower substrate. Illustratively, the touch assembly 103 may generally be located between the upper substrate (for example, a color filter substrate) and an upper polarizer. Moreover, in this case, both the upper and lower substrates are rigid substrates (for example, made of glass). Therefore, the touch flexible printed circuit board (TFPC) may be crimped with the touch assembly 103 on the color filter substrate, and the main flexible printed circuit board (MFPC) may be crimped with a display assembly on the lower substrate (for example, an array substrate). In this way, the signal line may be located in the display assembly on the lower substrate or in the touch assembly on the upper substrate, thus, it is impossible for the two flexible printed circuit boards (i.e., TFPC and MFPC) to penetrate the corresponding upper substrate or lower substrate to input signals to the signal line. In contrast, in the in-cell structure, the touch assembly 103 is generally located between the upper and lower substrates of the display panel 10. That is to say, the touch assembly is embedded in liquid crystal pixels. In this way, the signal line would be located between the upper substrate and the lower substrate, so that the two flexible printed circuit boards (TFPC and MFPC) can input signals to the signal line at the same time. Therefore, in the embodiments of the present disclosure, if the display panel 10 is a liquid crystal display panel, it is advantageous to design the touch assembly 103 to have an in-cell structure.

Next, an embodiment in which the display panel in the display module includes an OLED display panel will be discussed in detail.

Generally, the OLED display panel may be divided into two types: thin film encapsulation and substrate encapsulation. Specifically, for a thin film encapsulated OLED display panel, the encapsulation process is performed by using a thin film for encapsulation, and for a substrate-encapsulated OLED display panel, the encapsulation process is performed by using a rigid encapsulation substrate.

For the OLED display panel encapsulated by using a rigid encapsulation substrate, if the touch assembly 103 is designed to have an on-cell structure, then such a touch assembly 103 will be located at a side of the rigid encapsulation substrate away from the display assembly (for example, a base substrate). Therefore, similar to the reason as described above with reference to the LCD panel, for a substrate encapsulated OLED display panel, in the embodiments of the present disclosure, it is advantageous to design the touch assembly 103 in the display panel 10 to have an in-cell structure.

In contrast, for a thin film encapsulated OLED display panel, the touch assembly 103 in the display panel 10 may be of an in-cell structure (that is, the touch assembly 103 is disposed on a side of a thin film encapsulation layer near the substrate), alternatively it may be of an on-cell structure (that is, the touch assembly 103 is disposed on a side of the thin film encapsulation layer away from the base substrate). In this way, via holes may be formed in the thin film for encapsulation so that the two flexible printed circuit boards (i.e., TFPC and MFPC) may input signals to the signal line at the same time.

Of course, considering that the display device with an in-cell structure in the OLED display panel has disadvantages of low yield, high process requirement and the like, in practical applications, if the display panel is an OLED display panel, it is advantageous to design the above touch assembly 103 to have an on-cell structure (referring to FIG. 2, in which the touch assembly 103 is located on a light exiting side of the thin film for encapsulation TEF).

Further, in practical applications, in order to simplify the process and reduce the manufacturing cost, the signal line 20 and a data line may be formed of the same material in the same layer. For example, molybdenum, titanium, aluminum, chromium, magnesium and other electrically conductive materials may be used to form the signal line 20 and the data line in the same layer. This means that the signal line 20 and the data line are manufactured by the same patterning process. Herein, the arrangement of "same layer" is not limited to that two layers are at the same vertical height or have the same thickness. If the signal line and the data line are formed of the same material by one and the same patterning process, they are regarded as being in the same layer.

It should be noted that, in the embodiments of the present disclosure, the patterning process described above may include a photolithography process or include a photolithography process and an etching step. Of course, alternatively, such a patterning process may also include printing, inkjet, and other processes for forming a predetermined pattern. Specifically, the photolithography process refers to a process including film formation, exposure, development and the like, which uses a photoresist, a mask, an exposure machine, and the like to form patterns. Generally, in the embodiments of the present disclosure, a corresponding patterning process may be adopted according to the structure to be formed.

In addition, for a touch flexible printed circuit board (TFPC), the signal line 20 may generally be electrically connected through the second connection pattern located on the second side L2 of the display panel. In practical applications, in order to simplify the process and reduce the manufacturing cost, the above second connection pattern 200 and a touch pattern layer of the touch assembly 103 may be formed of the same material in the same layer. For example, molybdenum, titanium, aluminum, chromium, magnesium and other electrically conductive materials may be used to form the second connection pattern 200 and the touch pattern layer of the touch element 103 in the same layer. That is to say, the second connection pattern 200 and the touch pattern layer of the touch assembly 103 are manufactured by the same patterning process. This means that the second connection pattern 200 and the touch pattern layer of the touch assembly 103 are patterned by using the same conductive film. Regarding this specific embodiment, reference may be made to FIG. 3, which is an enlarged view of the S region in FIG. 2.

Figure 3:
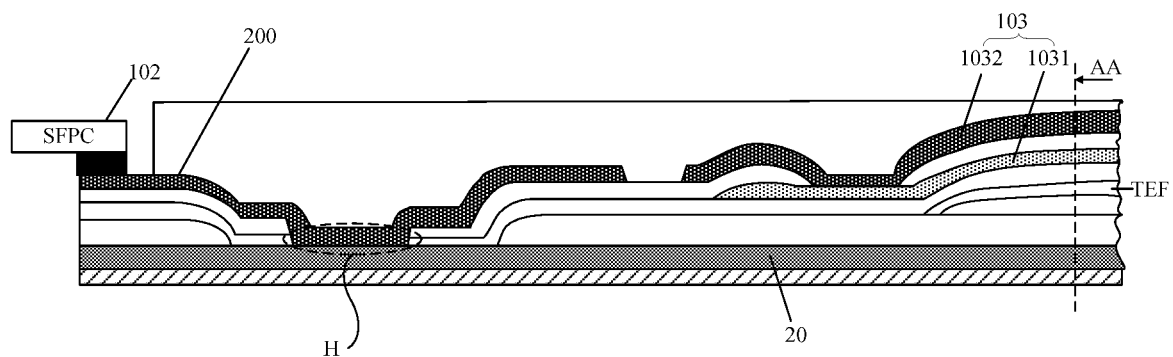
FIG. 3 is a partially enlarged schematic view of FIG. 2 at a position S.

Further, according to an embodiment of the present disclosure, as shown in FIG. 3, it is advantageous that the above-mentioned second connection pattern 200 is electrically connected to the signal line 20 through a via hole H located in the display panel. Of course, the via hole H may be one via hole in a film layer above the signal line 20 at the second side L2 of the display panel, or it may be one via hole in a plurality of film layers above the signal line 20 at the second side L2 of the display panel, and the present disclosure is intended to include all of these alternatives for the via hole. In practical applications, it is generally necessary to determine the implementation manner of the via hole according to the type and the specific manufacturing process of the display panel, as long as the second connection pattern 200 and the signal line 20 are electrically connected at the second side L2 of the display panel.

Next, the arrangement of same layer and the use of the same material of the second connection pattern 200 and the touch pattern layer of the touch assembly 103 will be described in detail.

As an example, in some embodiments of the present disclosure, the touch assembly 103 may be of a single-layer structure, that is, include only a touch pattern layer. In this case, the above-mentioned second connection pattern 200 and the touch pattern layer may be simply arranged in a same-layer and made of same-material.

As another example, in some other embodiments of the present disclosure, the touch assembly 103 may be of a two-layer structure. Such an implementation is clearly shown in FIG. 3, in which the touch assembly 103 includes a pattern layer 1031 and a bridge connection layer 1032. In this case, the second connection pattern 200 and the pattern layer 1031 may be arranged in a same-layer and made of same-material. Alternatively, the above-mentioned second connection pattern 200 and the bridge connection layer 1032 may be arranged in a same-layer and made of same-material. The present disclosure is intended to cover all these alternatives. In FIG. 3, as an example, the second connection pattern 200 and the bridge connection layer 1032 located on a side of the pattern layer 1031 away from the base substrate are arranged in a same-layer and made of same-material.

In an embodiment of the present disclosure, it further provides a display device, including the display module described in any one of the aforementioned embodiments. Accordingly, the display device has the same structure and beneficial effects as the display module provided in any one of the aforementioned embodiments. Since the structure and beneficial effects of the display module have been described in detail in the aforementioned embodiments, they will not be repeated herein.

It should be noted that, in the embodiments of the present disclosure, the display device may at least cover a liquid crystal display device and an organic light emitting diode display device. For example, the display device may be applied to any product or component having a display function, such as a display, a television, a digital photo frame, a mobile phone, or a tablet computer.

Figure 4:
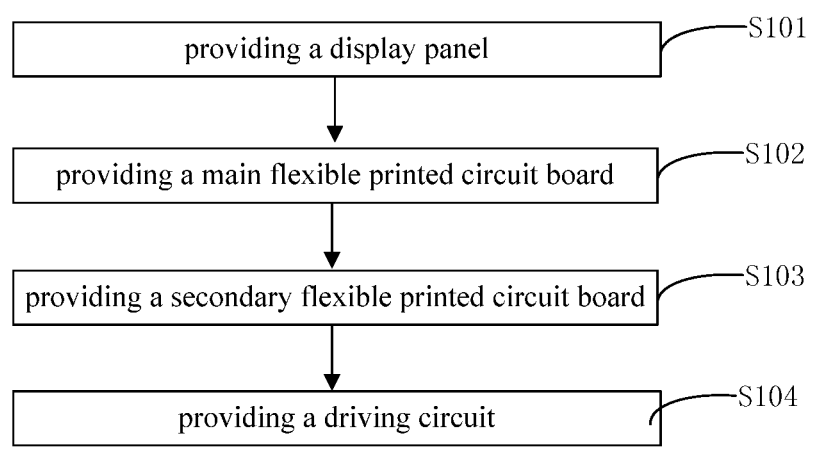
FIG. 4 is a flowchart of a method for manufacturing a display device according to an embodiment of the present disclosure.

According to another aspect of the present disclosure, there is further provided a method for manufacturing a display module in an embodiment. As shown in FIG. 4, the method for manufacturing the display module may include the following steps:

Step S101: providing a display panel, which includes a signal line.

Step S102: providing a main flexible printed circuit board, the main flexible printed circuit board being at least partially located on a first side of the display panel and being electrically connected to the signal line.

Step S103: providing a secondary flexible printed circuit board, the secondary flexible printed circuit board being at least partially located on a second side of the display panel and being electrically connected to the signal line.

Step S104: providing a driving circuit to provide signals to the signal line through the main flexible printed circuit board and the secondary flexible printed circuit board.

Thus, in the display module formed by using the manufacturing method provided by the embodiments of the present disclosure, the driving circuit simultaneously inputs, for example, voltage drain drain signals to the signal line through the main flexible printed circuit board on the first side and the secondary flexible printed circuit board on the second side. Thereby, compared with the case where a driving circuit is used to input a voltage drain drain signal from one side in a conventional scheme, in the embodiments of the present disclosure, the resistance drop (IR Drop) phenomenon due to the long-distance transmission on the signal line and the resistance of the signal line itself is effectively avoided, thereby facilitating the improvement of the long range uniformity (LRU) of the display device.

Further, according to a specific embodiment, the display panel 10 further includes a touch assembly having a touch pattern layer, the secondary flexible printed circuit board includes a touch flexible printed circuit board (TFPC), and the driving circuit includes an integrated circuit. In this case, the step of providing the driving circuit may include the following sub-steps: providing an integrated circuit on a portion of the main flexible printed circuit board extending from the first side to the center of the display panel, so that a first end of the integrated circuit is electrically connected to a first end of the main flexible printed circuit board, and a second end of the integrated circuit is electrically connected to a first end of the touch flexible printed circuit board.

Further, according to a specific embodiment, the step of providing a display panel may include the following sub-steps: forming a signal line 20 and a data line on the display panel 10 through the same patterning process; and forming on the display panel 10 a touch pattern layer, a first connection pattern on the first side and a second connection pattern on the second side through the same patterning process, so that both ends of the first connection pattern are electrically connected to the signal line 20 and a second end of the main flexible printed circuit board (MFPC), respectively, while both ends of the second connection pattern 200 are electrically connected to the signal line 20 and a second end of the secondary flexible printed circuit board (SFPC), respectively.

Further, according to a specific embodiment, the first connection pattern and the second connection pattern 200 are electrically connected to the signal line 20 through via holes H formed in the display panel 10, respectively.

It should be noted that, in all the above descriptions, the expression "and/or" is only intended to describe the association relationship of the associated objects. Such an expression means that there may be three kinds of relationship. For example, A and/or B may include three cases, i.e., A is present alone, A and B are present, and B is present alone. In addition, in this specification, the character "/" generally indicates an "or" relationship between two objects that are associated to each other.

Of course, it should be understood that, in the step S101 of providing the display panel 10 described above, in addition to the manufacturing of the above-mentioned data lines, touch pattern, and signal line, it may further include the manufacturing of other relatively well-known components such as pixel electrode, common electrode and so on, which will not be described in detail.

In addition, as for other contents related to the manufacturing method, reference may be made to the corresponding parts in the aforementioned embodiments of the display device, and details will not be described herein again. Further, as for the manufacturing methods of other related structures in the aforementioned embodiments of the display device, they may be manufactured according to commonly used manufacturing processes, which will not be described in detail.

The above only refers to the specific embodiments of the present disclosure, but the scope of the present disclosure is not limited thereto. Any change or substitution made by those skilled in the art within the technical scope of the present disclosure should be fallen into the scope of the present disclosure. Therefore, the scope of the present disclosure should be determined by the claim set attached herein.

What is claimed is:

1. A display module, comprising a display panel, a main flexible printed circuit board, a secondary flexible printed circuit board and a driving circuit, wherein:
   the display panel comprises a signal line;
   the main flexible printed circuit board is at least partially on a first side of the display panel and is electrically connected to the signal line;
   the secondary flexible printed circuit board is at least partially on a second side of the display panel and is electrically connected to the signal line; and
   the driving circuit is configured to provide signals to the signal line through the main flexible printed circuit board and the secondary flexible printed circuit board respectively.

2. The display module according to claim 1, wherein:
   the display panel further comprises a touch assembly; and
   the secondary flexible printed circuit board comprises a touch flexible printed circuit board.

3. The display module according to claim 2, wherein:
   the main flexible printed circuit board further comprises a portion extending from the first side to a center of the display panel, and the driving circuit is on the portion of the main flexible printed circuit board; and
   a first end of the driving circuit is electrically connected to a first end of the main flexible printed circuit board, and a second end of the driving circuit is electrically connected to a first end of the touch flexible printed circuit board.

4. The display module according to claim 3, wherein:
   the signal line and the data line of the display panel are formed of a same material and in a same layer; and
   the display panel further comprises a first connection pattern on the first side and a second connection pattern on the second side, wherein both ends of the first connection pattern are respectively electrically connected to the signal line and a second end of the main flexible printed circuit board, and both ends of the second connection pattern are respectively electrically connected to the signal line and a second end of the touch flexible printed circuit board.

5. The display module according to claim 4, wherein:
   the first connection pattern and the second connection pattern are electrically connected to the signal line through via holes, respectively.

6. The display module according to claim 4, wherein:
   the touch assembly has a touch pattern layer; and
   the first connection pattern and the second connection pattern are both formed in a same layer as the touch pattern layer and formed of a same material as the touch pattern layer.

7. The display module according to claim 1, wherein:
   the first side and the second side are opposite to each other.

8. The display module according to claim 2, further comprising:
   a bottom film, a super clean foam protective film, and a structured organic film between the display panel and the driving circuit; and
   a thin film for encapsulation between the touch assembly and the signal line.

9. The display module according to claim 2, wherein:
   the display panel comprises an OLED display panel;
   the OLED display panel further comprises a base substrate and a thin film for encapsulation opposite to each other; and
   the touch assembly is on a side of the thin film for encapsulation away from the base substrate.

10. The display module according to claim 2, wherein:
    the display panel comprises a liquid crystal display panel;
    the liquid crystal display panel comprises a first substrate and a second substrate opposite to each other; and
    the touch assembly is between the first substrate and the second substrate.

11. A display device, comprising the display module according to claim 1.

12. The display module according to claim 1, wherein:
    the driving circuit is disposed at a side of the display panel opposite to a display surface thereof.

13. The display module according to claim 1, wherein:
    the driving circuit comprises an integrated circuit.

14. The display module according to claim 1, wherein:
    the main flexible printed circuit board is bent from a display surface of the display panel to a side of the display panel opposite to the display surface, and/or the secondary flexible printed circuit board is bent from a display surface of the display panel to a side of the display panel opposite to the display surface.

15. A method for manufacturing a display module, the method comprising:
- providing a display panel, which comprises a signal line;
- providing a main flexible printed circuit board, the main flexible printed circuit board being at least partially on a first side of the display panel and being electrically connected to the signal line;
- providing a secondary flexible printed circuit board, the secondary flexible printed circuit board being at least partially on a second side of the display panel and being electrically connected to the signal line; and
- providing a driving circuit to provide signals to the signal line through the main flexible printed circuit board and the secondary flexible printed circuit board respectively.

16. The method according to claim 15, wherein:
the display panel further comprises a touch assembly; and
the secondary flexible printed circuit board comprises a touch flexible printed circuit board.

17. The method according to claim 16, wherein the touch assembly has a touch pattern layer, and wherein providing a driving circuit comprises a sub-step:
- providing the driving circuit on a portion of the main flexible printed circuit board extending from the first side to a center of the display panel, so that a first end of the driving circuit is electrically connected to a first end of the main flexible printed circuit board, and a second end of the driving circuit is electrically connected to a first end of the touch flexible printed circuit board.

18. The method according to claim 17, wherein the providing a display panel comprises sub-steps:
- forming a signal line and a data line on the display panel through a same patterning process; and
- forming on the display panel a touch pattern layer, a first connection pattern on the first side and a second connection pattern on the second side through a same patterning process, so that both ends of the first connection pattern are electrically connected to the signal line and a second end of the main flexible printed circuit board, respectively, while both ends of the second connection pattern are electrically connected to the signal line and a second end of the secondary flexible printed circuit board, respectively.

19. The method according to claim 18, wherein:
the first connection pattern and the second connection pattern are electrically connected to the signal line through via holes which are formed in the display panel, respectively.

* * * * *